(12) United States Patent
Chen et al.

(10) Patent No.: US 9,991,197 B2
(45) Date of Patent: Jun. 5, 2018

(54) FABRICATION METHOD OF SEMICONDUCTOR PACKAGE

(71) Applicant: Siliconware Precision Industries Co., Ltd., Taichung (TW)

(72) Inventors: Chia-Cheng Chen, Taichung (TW);
Chi-Ching Ho, Taichung (TW);
Shao-Tzu Tang, Taichung (TW);
Yu-Che Liu, Taichung (TW);
Ying-Chou Tsai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days. days.

(21) Appl. No.: 15/632,669

(22) Filed: Jun. 26, 2017

(65) Prior Publication Data

US 2017/0294372 A1 Oct. 12, 2017

Related U.S. Application Data

(62) Division of application No. 13/729,963, filed on Dec. 28, 2012, now abandoned.

(30) Foreign Application Priority Data

Oct. 2, 2012 (TW) .............................. 101136309 A

(51) Int. Cl.
*H01L 29/40* (2006.01)
*H01L 23/498* (2006.01)
*H01L 21/48* (2006.01)
*H01L 21/56* (2006.01)
(Continued)

(52) U.S. Cl.
CPC .... *H01L 23/49838* (2013.01); *H01L 21/4853* (2013.01); *H01L 21/565* (2013.01); *H01L 21/568* (2013.01); *H01L 23/3114* (2013.01); *H01L 23/49894* (2013.01); *H01L 24/16* (2013.01); *H01L 24/48* (2013.01); *H01L 24/73* (2013.01); *H01L 2224/16227* (2013.01); *H01L 2224/48227* (2013.01);
(Continued)

(58) Field of Classification Search
None
See application file for complete search history.

(56) References Cited

U.S. PATENT DOCUMENTS

| 5,541,450 A | 7/1996 | Jones et al. |
| 5,990,545 A | 11/1999 | Schueller et al. |
| 6,882,042 B2 | 4/2005 | Zhao et al. |

(Continued)

*Primary Examiner* — Sitaramarao S Yechuri
(74) *Attorney, Agent, or Firm* — Mintz Levin Cohn Ferris Glovsky and Popeo, P.C.; Peter F. Corless; Steven M. Jensen

(57) ABSTRACT

A semiconductor package is provided, which includes: a dielectric layer made of a material used for fabricating built-up layer structures; a conductive trace layer formed on the dielectric layer; a semiconductor chip is mounted on and electrically connected to the conductive trace layer; and an encapsulant formed over the dielectric layer to encapsulate the semiconductor chip and the conductive trace layer. Since a strong bonding is formed between the dielectric layer and the conductive trace layer, the present invention can prevent delamination between the dielectric layer and the conductive trace layer from occurrence, thereby improving reliability and facilitating the package miniaturization by current fabrication methods.

9 Claims, 8 Drawing Sheets

(51) Int. Cl.
  *H01L 23/31*    (2006.01)
  *H01L 23/00*    (2006.01)

(52) U.S. Cl.
  CPC ............ *H01L 2224/73204* (2013.01); *H01L 2224/73265* (2013.01); *H01L 2924/35121* (2013.01)

(56) References Cited

U.S. PATENT DOCUMENTS

| | | |
|---|---|---|
| 2001/0014538 A1 | 8/2001 | Kwan et al. |
| 2001/0052647 A1* | 12/2001 | Plepys .................... H01L 21/50 257/738 |
| 2003/0179549 A1 | 9/2003 | Zhong et al. |
| 2004/0106229 A1 | 6/2004 | Jiang et al. |
| 2005/0051890 A1 | 3/2005 | Zhang et al. |
| 2006/0163749 A1 | 7/2006 | Lee et al. |
| 2006/0180914 A1 | 8/2006 | Ha et al. |
| 2008/0116580 A1* | 5/2008 | Jiang .................... H01L 21/561 257/766 |
| 2009/0146298 A1 | 6/2009 | Masumoto |
| 2011/0140253 A1 | 6/2011 | Lee et al. |
| 2011/0156227 A1 | 6/2011 | Lin et al. |
| 2011/0159543 A1 | 6/2011 | Verschuur et al. |
| 2012/0043656 A1* | 2/2012 | Hayashi ............ H01L 23/49838 257/738 |
| 2012/0049363 A1 | 3/2012 | Tsai |
| 2013/0069241 A1* | 3/2013 | Lin ........................ H01L 24/97 257/774 |
| 2013/0249068 A1 | 9/2013 | Do et al. |

* cited by examiner

FABRICATION METHOD OF SEMICONDUCTOR PACKAGE

CROSS-REFERENCE TO RELATED APPLICATIONS

This application is a divisional of copending application U.S. Ser. No. 13/729,963, filed on Dec. 28, 2012, which claims under 35 U.S.C. § 119(a) the benefit of Taiwanese Patent Application No. 101136309, filed on Oct. 2, 2012, the entire contents of which are incorporated herein by reference.

BACKGROUND OF THE INVENTION

1. Field of the Invention

The present invention relates to semiconductor packages and fabrication methods thereof, and more particularly, to a carrier-free semiconductor package and a fabrication method thereof.

2. Description of Related Art

Conventionally, there are various kinds of semiconductor packages that utilize lead frames as chip carriers. For example, a QFN (Quad Flat Non-leaded) semiconductor package is a lead frame based chip scale package, which is characterized by the fact that the leads thereof do not extend out from the package sides as in a conventional quad flat package (QFP), thereby reducing the overall package size. However, limited by the encapsulant thickness of the QFN package, the QFN package thickness cannot be further reduced to meet the demands for lighter, thinner, shorter and smaller semiconductor product trends. Therefore, carrier-free semiconductor packages have been developed to reduce the thickness of the overall package size by dispensing with a lead frame.

FIGS. 1A to 1D are schematic cross-sectional views illustrating a fabrication method of a semiconductor package 1 according to the prior art.

Referring to FIG. 1A, the surface of a metal carrier 10 is partially removed by etching to form a plurality of wire bonding pads 101 and at least a die attach pad 102.

Referring to FIG. 1B, a solder mask layer 11 such as green paint is formed on the metal carrier 10, and the wire bonding pads 101 and the die attach pad 102 covered by an antioxidation layer 15 are exposed from the solder mask layer 11.

Referring to FIG. 1C, a semiconductor chip 17 is disposed on the die attach pad 102 through an adhesive 171 and electrically connected to the wire bonding pads 101 through a plurality of bonding wires 170 such as gold wires. Then, an encapsulant 18 is formed on the solder mask layer 11 to encapsulate the semiconductor chip 17 and the bonding wires 170.

Referring to FIG. 1D, the metal carrier 10 is removed by etching to expose lower surfaces of the wire bonding pads 101 and the die attach pad 102.

However, referring to FIG. 1D', since the bonding wires 170 often cross over each other, they may easily come into contact with each other, thereby resulting in a short circuit.

Further, there are special limitations on loop height and length of the bonding wires 170 and hence the layout of the wire bonding pads 101 is limited by the wire bonding range of the bonding wires 170.

Furthermore, referring to FIG. 1D', the wire bonding pads 101 located outside around the periphery of the semiconductor chip 17 are distant from the electrode pads 17a of the semiconductor chip 17, therefore longer bonding wires 170 are required, thereby increasing material cost and adversely affecting the miniaturization of the semiconductor package 1.

Accordingly, another fabrication method of a semiconductor package 2 has been developed, as shown in FIGS. 2A to 2E.

Referring to FIG. 2A, a conductive trace layer 24 is formed on a copper carrier 20 by electroplating. The conductive trace layer 24 has a plurality of bonding pads 241, a plurality of connection pads 242, and at least a die attach pad 243. The conductive trace layer 24 is made of Pd/Ni/Pd/Au.

Referring to FIG. 2B, at least a semiconductor chip 27 is disposed on the die attach pad 243 through an adhesive 271 such as silver epoxy, and electrically connected to the bonding pads 241 through a plurality of bonding wires 270.

Then, an encapsulant 28 is formed on the copper carrier 20 to encapsulate the semiconductor chip 27 and the conductive trace layer 24.

Referring to FIG. 2C, by using the gold material at the bottom of the conductive trace layer 24 as an etching stop layer, the copper carrier 20 is almost removed by etching.

Referring to FIG. 2D, an ultra-thin copper layer 25 is formed on the bonding pads 241, the connection pads 242, and the die attach pad 243. Then, a solder mask layer 21 such as green paint is formed on the encapsulant 28 and a plurality of openings 210 are formed in the solder mask layer 21 for exposing portions of the ultra-thin copper layer 25 on the connection pads 242 and the die attach pad 243.

Referring to FIG. 2E, by using the ultra-thin copper layer as a current conductive path, an electroplating process is performed to form a plurality of solder balls 29 on the ultra-thin copper layer 25 at the openings 210 of the solder mask layer 21.

In the above-described method, the conductive trace layer 24 is formed first and then the solder mask layer 21 is formed to cover a portion of the conductive trace layer 24. The solder mask layer 21 has a poor bonding with the gold material of the conductive trace layer 24 (the ultra-thin copper layer 25 has negligible effect on the bonding between the solder mask layer 21 and the conductive trace layer 24). Therefore, after the solder balls 29 are formed, delamination can easily occur around the peripheries of the openings of the solder mask layer 21, thus easily causing solder ball drop failure and consequently reducing package reliability.

Further, the gold material used in the conductive trace layer 24 results in a high fabrication cost.

Therefore, there is an urgent need to provide a semiconductor package and a fabrication method thereof to overcome the above-described disadvantages.

SUMMARY OF THE INVENTION

In view of the above-described disadvantages, the present invention provides a semiconductor package, which comprises: a dielectric layer used for fabricating built-up layer structures having opposite first and second surfaces, and a plurality of openings penetrating the first and second surfaces; a conductive trace layer formed on the first surface of the dielectric layer, wherein the conductive trace layer has a plurality of traces, each of the traces electrically connects a bonding pad and a connection pad, and the connection pads are exposed through the openings of the dielectric layer; at least a semiconductor chip attached to the first surface of the dielectric layer having a plurality of electrode pads; and a plurality of bonding wires electrically connecting the electrode pads of the semiconductor chip to the bonding pads.

In the above-described package, the conductive trace layer can further have a die attach pad on which the semiconductor chip is mounted, and the semiconductor chip is electrically connected to the die attach pad.

In the above-described package, the bonding pads can be formed outside the periphery of the semiconductor chip.

In the above-described package, the bonding pads can be formed between the connection pads and the semiconductor chip.

The present invention provides another semiconductor package, which comprises: a dielectric layer used for fabricating built-up layer structures having opposite first and second surfaces, and a plurality of openings penetrating the first and second surfaces; a conductive trace layer formed on the first surface of the dielectric layer, wherein the conductive trace layer has a plurality of traces, each of the traces electrically connects a bonding pad and a connection pad, and the connection pads are exposed through the openings of the dielectric layer; a plurality of conductive bumps formed on the respective bonding pads; and at least a semiconductor chip disposed on the conductive bumps, wherein the semiconductor chip has a plurality of electrode pads electrically connected to the bonding pads through the conductive bumps.

The present invention further provides a fabrication method of a semiconductor package, which comprises the steps of: providing a carrier having a dielectric layer formed on a surface thereof, wherein the dielectric layer is used for fabricating built-up layer structures; forming a conductive trace layer on the dielectric layer, wherein the conductive trace layer has a plurality of traces, each of the traces electrically connects a bonding pad and a connection pad; attaching at least a semiconductor chip to the dielectric layer and electrically connecting the bonding pads to the semiconductor chip; forming an encapsulant over the dielectric layer to encapsulate the semiconductor chip and the conductive trace layer; removing the carrier while retaining the dielectric layer on the encapsulant; and forming a plurality of openings, through which the connection pads are exposed, penetrating the dielectric layer.

In the above-described method, the carrier can be made of metal.

In the above-described method, the conductive trace layer can be formed by electroplating.

In the above-described method, the semiconductor chip can be electrically connected to the bonding pads through bonding wires or conductive bumps.

In the above-described method, the conductive trace layer can further have a die attach pad on which the semiconductor chip is mounted.

In the above-described method, the carrier can be removed by etching.

In the above-described packages and method, the dielectric layer can be made of a material selected from the groups consisting of polyimide, ABF (Ajinomoto Build-up Film), a glass epoxy composite material, a fiber reinforced glass composite material, and a glass ceramic and epoxy composite material.

In the above-described packages and method, a surface treated layer can further be formed on the bonding pads.

In the above-described packages and method, an adhesive can further be formed between the dielectric layer and the semiconductor chip.

In the above-described packages and method, an encapsulant can further be formed over the first surface of the dielectric layer to encapsulate the semiconductor chip and the conductive trace layer.

In the above-described packages and method, a plurality of solder balls can further be formed at the openings of the dielectric layer, respectively.

According to the present invention, a dielectric layer made of a material used for fabricating built-up layer structures is formed to serve as an etching stop layer and a solder mask layer so as for a conductive trace layer made of copper or aluminum to be formed thereon. Therefore, the present invention eliminates the need of a gold material used in forming the conductive trace layer and dispenses with the conventional solder mask layer and electroless plated copper layer, thereby reducing fabrication cost.

Further, since a strong bonding is formed between the dielectric layer and copper or aluminum, the present invention prevents the delamination occurring around the peripheries of the openings of the dielectric layer, thus avoiding solder ball drop failure and improving product reliability.

In addition, the dielectric layer provides a strong support to the package structure so as to avoid solder ball drop failure.

BRIEF DESCRIPTION OF DRAWINGS

FIG. 1D is a schematic cross-sectional view along a sectional line A-A of FIG. 1D';

DETAILED DESCRIPTION OF PREFERRED EMBODIMENTS

The following embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "first", "second", "upper", "lower", "a" etc. are merely for illustrative purpose and should not be construed to limit the scope of the present invention.

FIGS. 3A to 3F are schematic cross-sectional views illustrating a fabrication method of a semiconductor package according to the present invention.

Figure 1A:
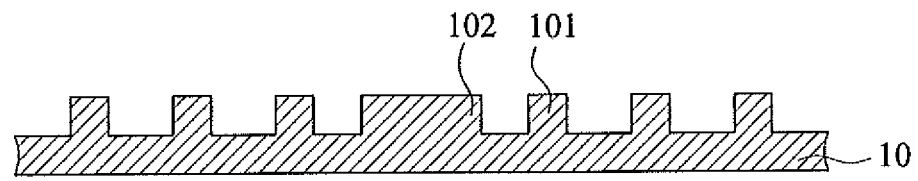
FIGS. 1A to 1D are schematic cross-sectional views illustrating a fabrication method of a semiconductor package according to the prior art, wherein FIG. 1D' is a schematic upper view of part of the semiconductor package
Figure 1B:
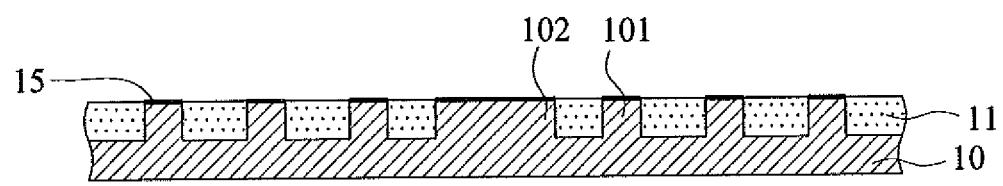
Figure 1C:
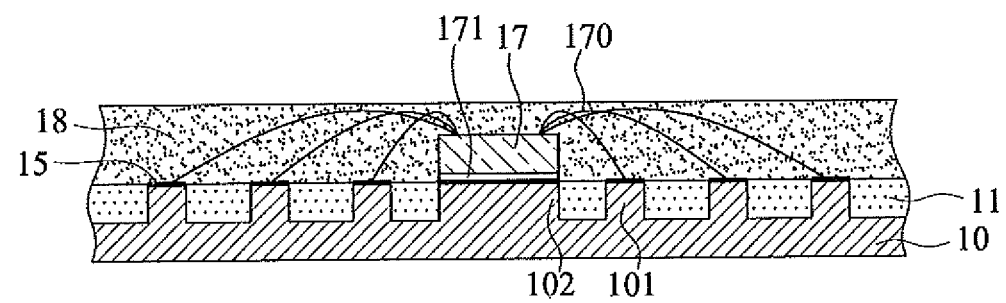
Figure 1D:
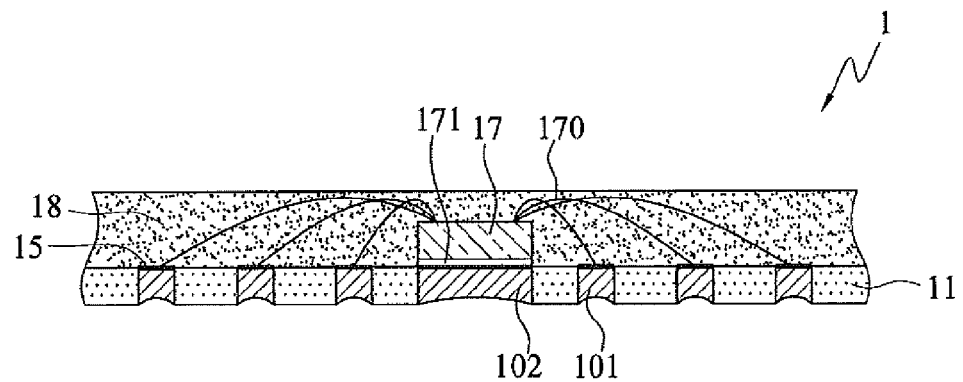
Figure 1D:
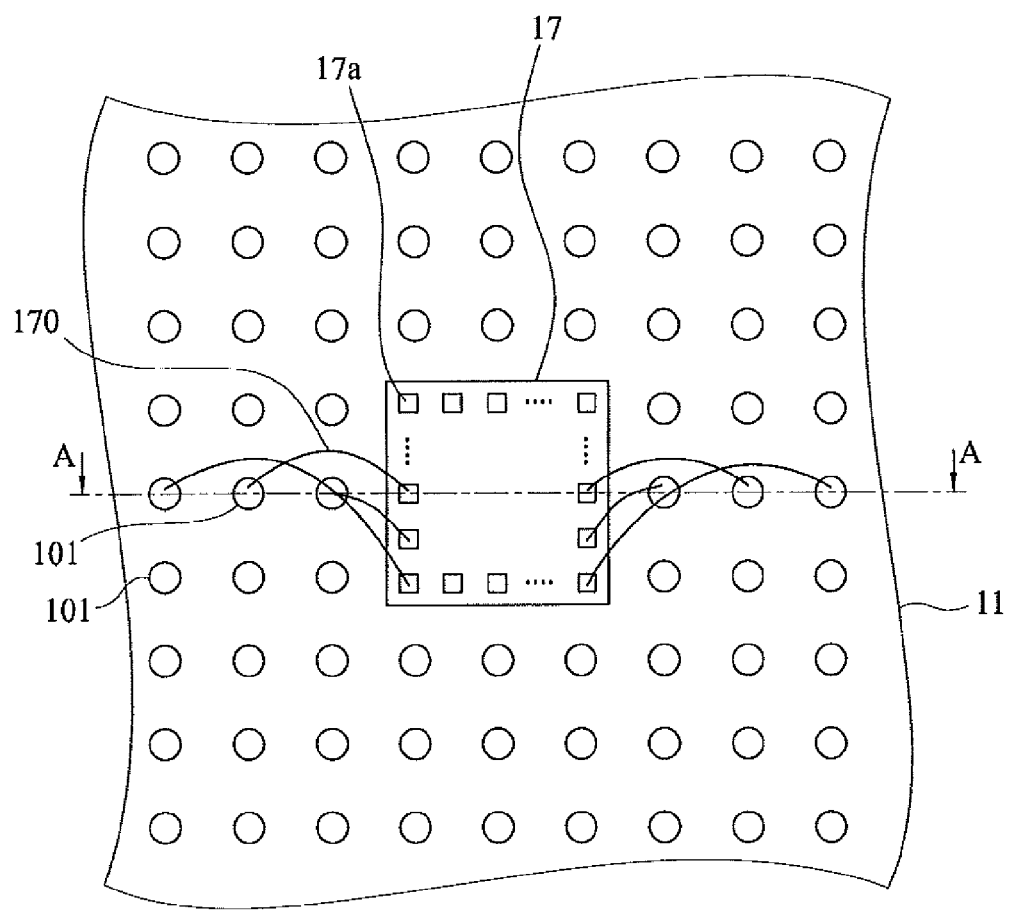
Figure 2A:
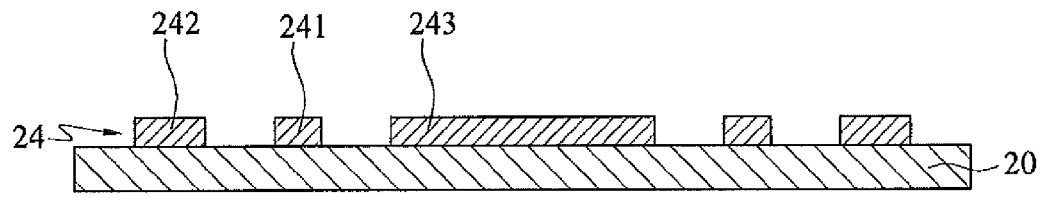
FIGS. 2A to 2E are schematic cross-sectional views illustrating another fabrication method of a semiconductor package according to the prior art.
Figure 2B:
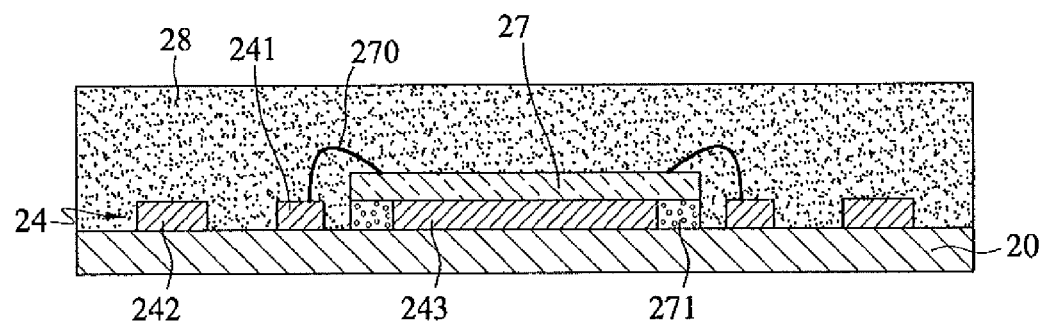
Figure 2C:
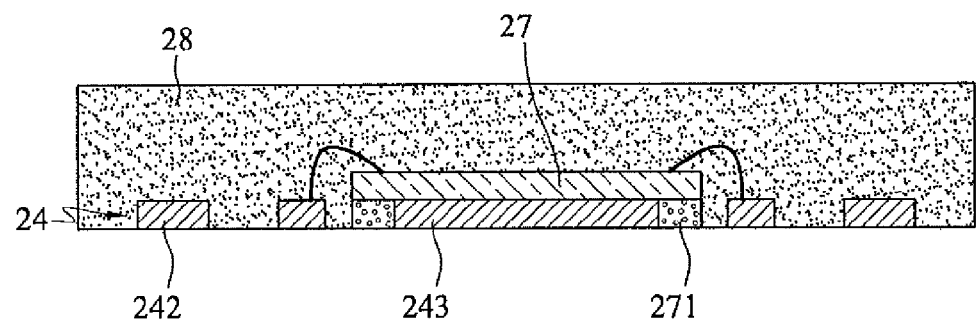
Figure 2D:
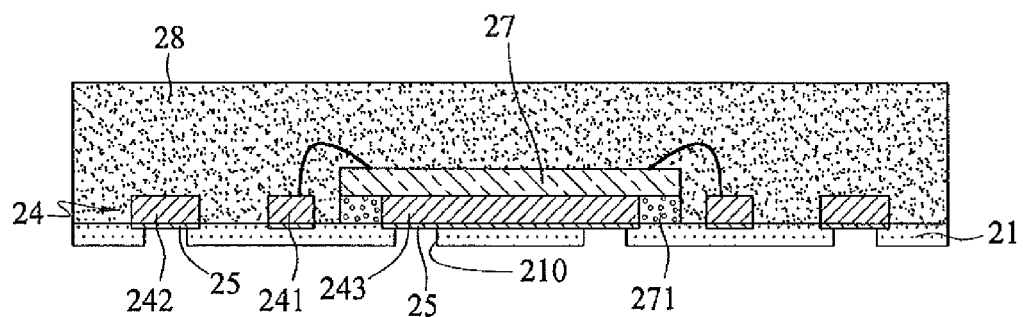
Figure 2E:
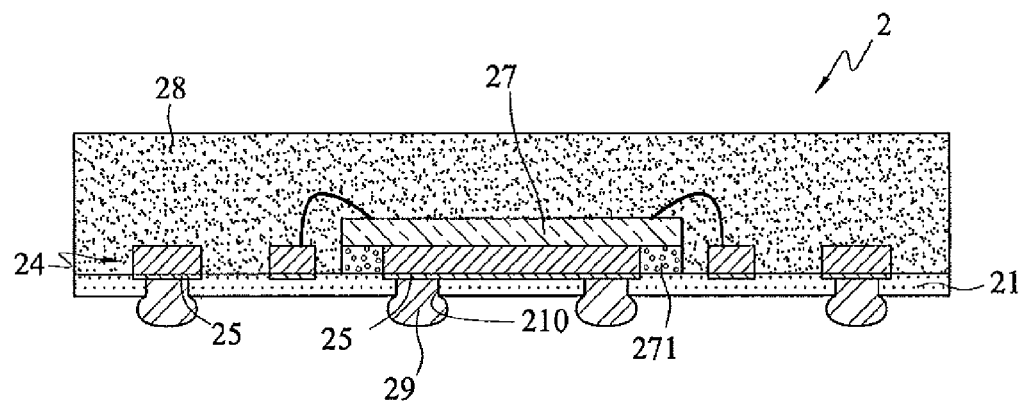
Figure 3A:
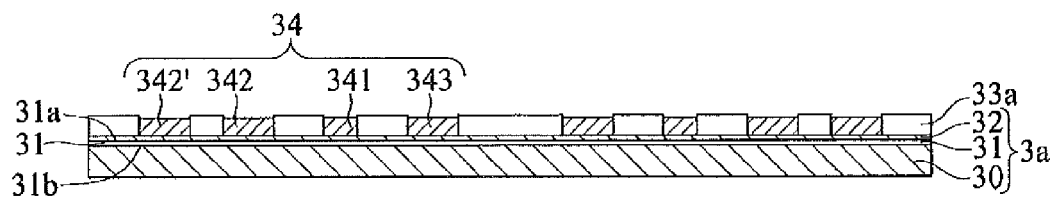
FIGS. 3A to 3F are schematic cross-sectional views illustrating a fabrication method of a semiconductor package according to the present invention, wherein FIG. 3F' shows another embodiment of FIG. 3F, and FIG. 3F''' is a schematic upper view of FIG. 3F' without the encapsulant.

Referring to FIG. 3A, a carrying structure 3a is provided, which has a carrier 30, a dielectric layer 31 used for fabricating built-up layer structures, and a conductive layer 32. Further, a first patterned resist layer 33a is formed on the conductive layer 32 for exposing portions of the conductive layer 32.

In the present embodiment, the dielectric layer 31 can be made of one of the materials selected from polyimide, ABF (Ajinomoto Build-up Film), a glass epoxy composite material, a fiber reinforced glass composite material, or a glass ceramic and epoxy composite material. Compared with the conventional prepreg material, the dielectric material of the present invention facilitates to alleviate the CTE mismatch between the encapsulant and the dielectric material and resist cracking while being pressed during a subsequent molding process.

Then, by using the conductive layer 32 as a current conductive path, an electroplating process is performed to form a conductive trace layer 34 on the dielectric layer 31. The conductive trace layer 34 has a plurality of traces 340 (as shown in FIG. 3F"), a plurality of bonding pads 341 and connection pads 342 connected through the traces 340, and at least a die attach pad 343. In the present embodiment, the die attach pad 343 is used for a semiconductor chip to be mounted thereon and not connected to the traces 340. In other embodiments, the die attach pad 343 can be electrically grounded and connected to the connection pads 342, 342' through the traces 340.

In the present embodiment, the carrier 30 and the conductive layer 32 are substantially made of metal such as copper or aluminum. The conductive layer 32 serves as a current conductive path for electroplating. The conductive trace layer 34 is substantially made of copper or aluminum.

The carrier 30, the dielectric layer 31 and the conductive layer 32 form a carrying structure 3a.

The bonding pads 341 serve as wire bonding pads and are formed outside the periphery of the die attach pad 343 and located between the die attach pad 343 and the connection pads 342, 342'.

The dielectric layer 31 has an upper surface, i.e., a first surface 31a and a lower surface, i.e., a second surface 31b that is opposite to the first surface 31a. The dielectric layer 31a is bonded to the conductive layer 32 through the first surface 31a and bonded to the carrier 30 through the second surface 31b.

Figure 3B:
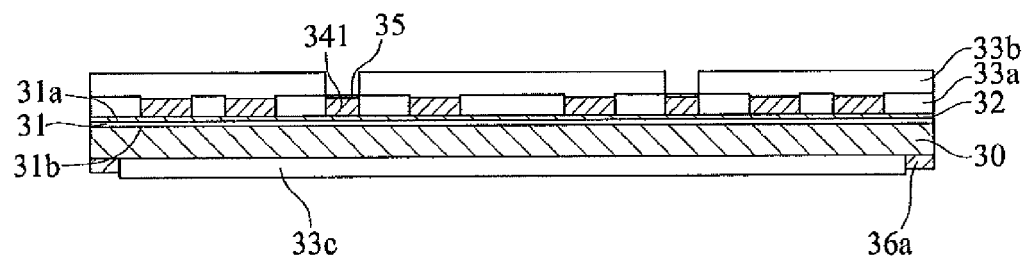

Referring to FIG. 3B, a second patterned resist layer 33b is formed on the first patterned resist layer 33a and the bonding pads 341 are exposed from the second patterned resist layer 33b. Then, a surface treated layer 35 is formed on the bonding pads 341.

Meanwhile, a third patterned resist layer 33c is formed on the lower side of the carrier 30 such that a support layer 36a is formed on the carrier 30.

In the present embodiment, the support layer 36a and the surface treated layer 35 are made of same materials, such as electroless nickel/gold, ENEPIG (Electroless Nickel/Electroless Palladium/Immersion Gold), DIG (Direct Immersion Gold) or electroplated nickel/electroless palladium/electroplated gold.

Figure 3C:
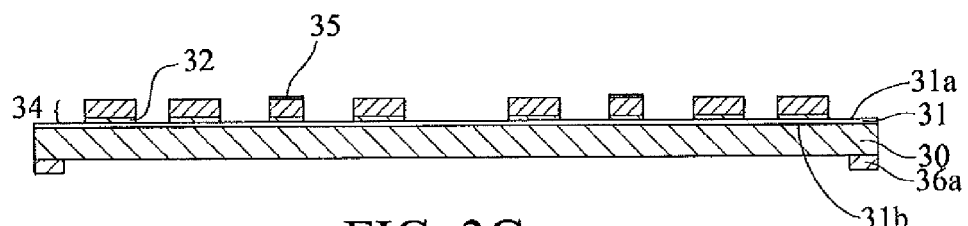

Referring to FIG. 3C, the first, second and third patterned resist layers 33a, 33b and 33c and the conductive layer 32 under the first patterned resist layer 33a are removed.

Figure 3D:
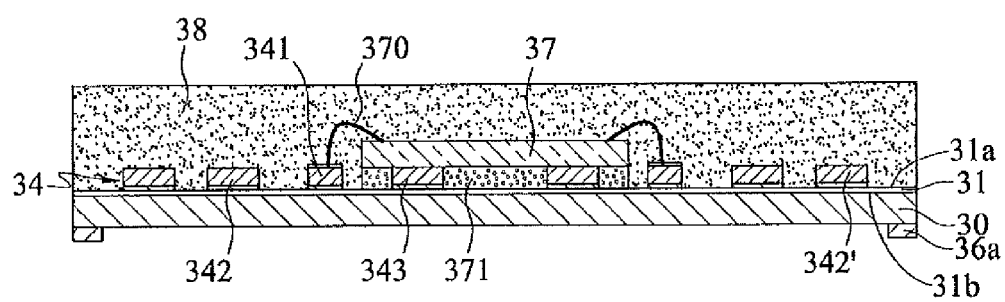

Referring to FIG. 3D, a semiconductor chip 37 is disposed on the die attach pad 343 through an adhesive 371 such as a silver epoxy and electrically connected to the bonding pads 341 through a plurality of bonding wires 370.

Then, an encapsulant 38 is formed over the dielectric layer 31 to encapsulate the semiconductor chip 37 and the conductive trace layer 34.

In the present embodiment, referring to FIG. 3F", the semiconductor chip 37 has a plurality of electrode pads 37a that are electrically connected to the bonding pads 341 through the bonding wires 370.

The bonding pads 341 are formed outside around the periphery of the semiconductor chip 37 and located between the semiconductor chip 37 and the connection pads 342, 342'.

In another embodiment, the bonding pads 341 can be formed between the connection pads 342, 342'.

In another embodiment, the die attach pad 343 can be omitted and the semiconductor chip 37 can be directly disposed on the first surface 31a of the dielectric layer 31.

Referring to FIG. 3F", since the bonding wires 370 are not directly connected to the connection pads 342, 342', the present invention overcomes the conventional disadvantage of bonding wire crossing, thus preventing short circuits in the package.

Through the configuration of the traces 340, the layout of the bonding pads 341 becomes more flexible and that of the connection pads 342, 342' is, therefore, not limited by the wire bonding range of the bonding wires 370.

Further, the present invention shortens the distance between the bonding pads 341 and the electrode pads 37a (including I/O contact pads) of the semiconductor chip 37, thereby shortening the length of the bonding wires 370 and consequently reducing the cost and facilitating the miniaturization of the semiconductor package 3.

Furthermore, referring to FIG. 3F", the total number of the connection pads 342, 342' of the conductive trace layer 34 can be greater than or equal to the number of the electrode pads 37a (including I/O contact pads) of the semiconductor chip 37.

Figure 3E:
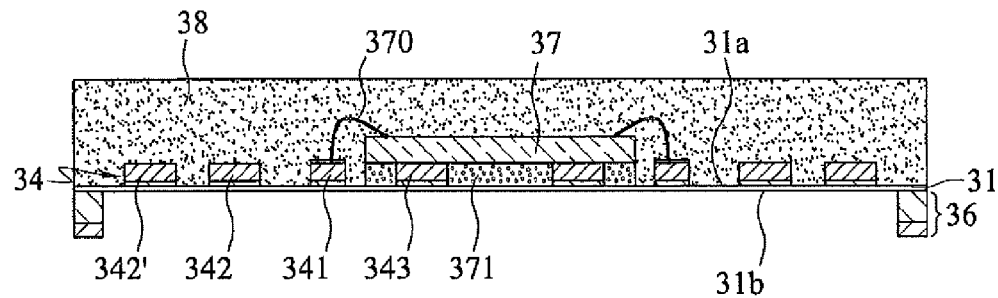
Figure 3F:
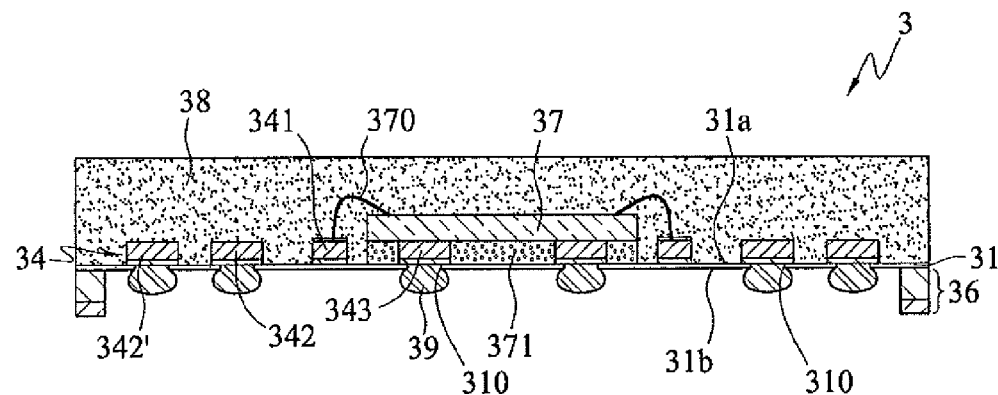
Figure 3F:
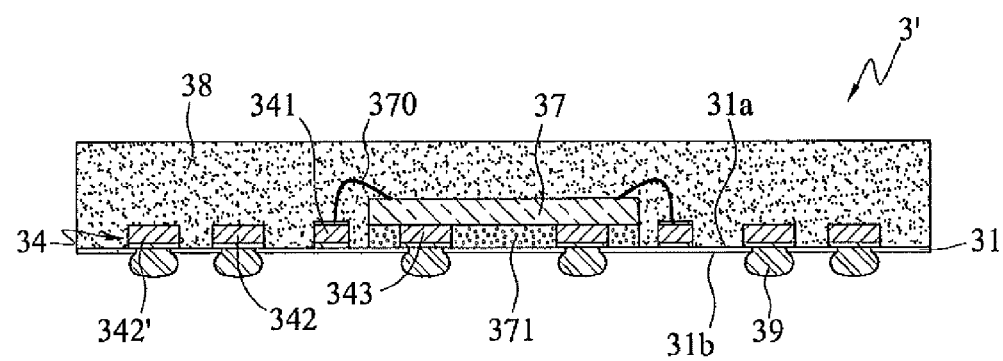
Figure 3F:
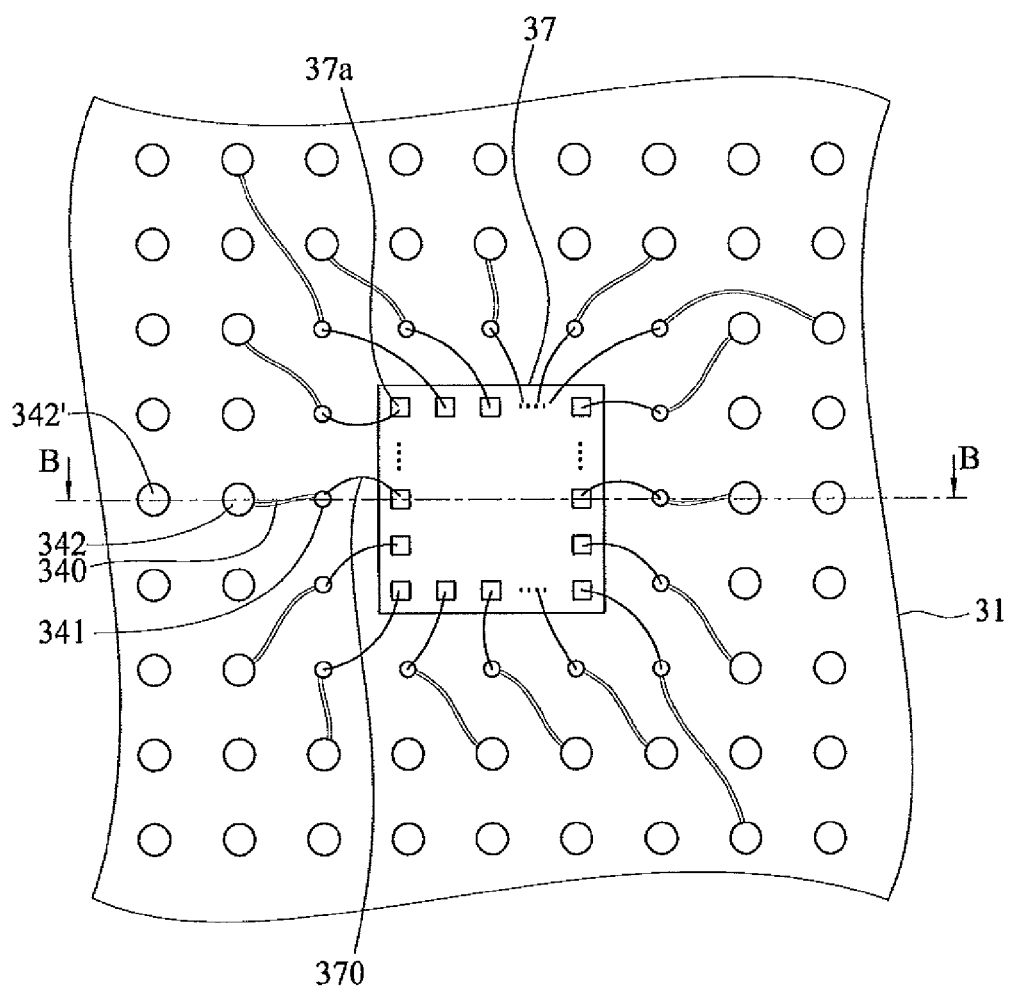

Referring to FIG. 3E, a portion of the carrier 30 that is exposed from the support layer 36a is removed by etching while the dielectric layer 31 remains on the encapsulant 38, thereby forming a support structure 36 on the second surface 31b of the dielectric layer 31.

Referring to FIG. 3F, a plurality of openings 310 are formed on the second surface 31b of the dielectric layer 31 to expose the connection pads 342, 342' and the die attach pad 343, and a plurality of solder balls 39 are formed on the connection pads 342, 342' and the die attach pad 343 at the openings 310 of the dielectric layer 31. As such, a ball grid array is formed on the bottom of the semiconductor package 3. The die attach pad 343 can be grounded according to the application requirement.

In the present embodiment, the support structure 36 serves as a test structure in the fabrication process.

In another embodiment, the outermost connection pads 342' are exposed from the openings 310.

The dielectric layer 31 can be used to protect the traces. Therefore, the conventional solder mask layer is omitted in the present invention.

For purposes of simplification, FIG. 3F" only show a portion of the electrode pads 37a and the traces 340. Accordingly, some of the electrode pads 37a are shown by ".", and only some of the traces 340 are shown. Therefore, some of the connection pads 342, 342' are not shown to be connected to the traces 340. In practice, the connection pads 342, 342' should be connected to the ends of the traces 340.

In another embodiment, referring to FIG. 3F', the support structure 36 can be omitted. That is, the carrier 30 is completely removed in the process of FIG. 3E.

According to the present invention, a soft dielectric layer 31 made of a material used for fabricating built-up layer structures is formed, and a conductive trace layer 34 made of copper or aluminum is formed on the dielectric layer 31. Since the dielectric layer 31 has a good bonding with copper or aluminum, the present invention prevents delamination occurring around the peripheries of the openings 310 of the dielectric layer 31, thereby avoiding solder ball drop failure and improving product reliability.

Further, the dielectric layer 31 provides a strong support to the package structure to avoid solder ball drop failure. The dielectric layer 31 further serves as an etching stop layer. Therefore, the present invention eliminates the need of a gold material used in forming the conductive trace layer in order to reduce fabrication cost.

Furthermore, by using the dielectric layer 31 as a solder mask layer after removing the carrier 30, the present invention dispenses with the conventional solder mask layer, thus reducing fabrication cost. In addition, since the conductive trace layer 34 is made of copper or aluminum, before forming the solder balls 39, the present invention does not require performing the conventional electroless copper plating process, thereby greatly reducing fabrication cost.

Moreover, by replacing the conventional long bonding wires with the conductive trace layer 34 made of copper or aluminum, the cost is reduced and the miniaturization of the semiconductor package 3 is facilitated.

Figure 4:
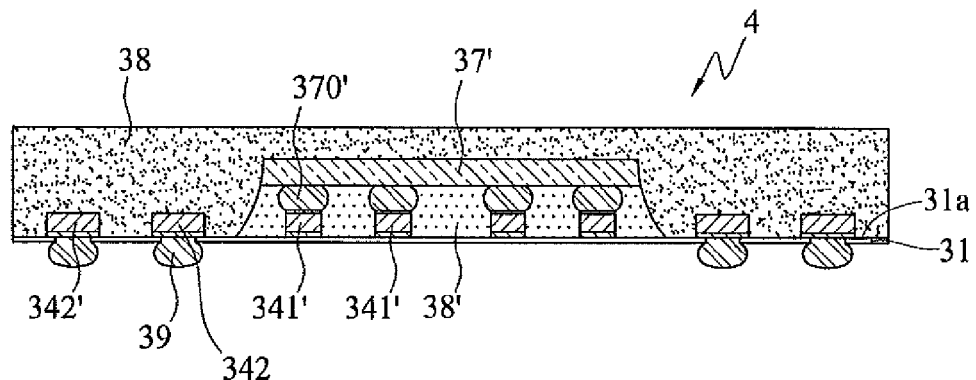
FIG. 4 is a schematic cross-sectional view illustrating a semiconductor package according to another embodiment of the present invention.
Figure 5:
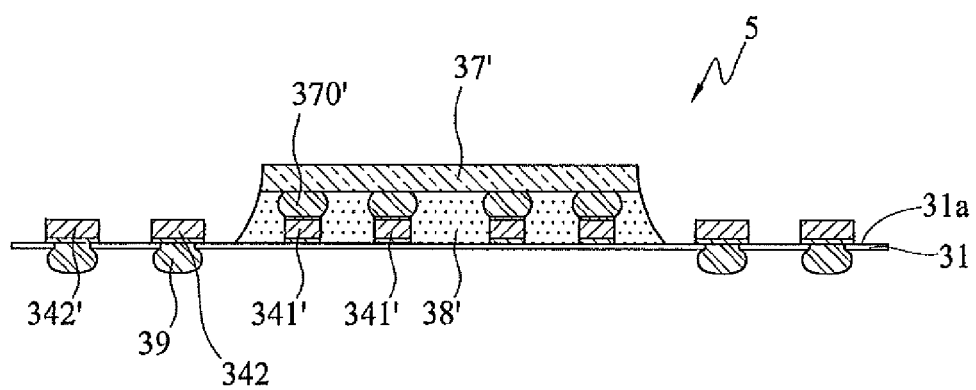
FIG. 5 is a schematic cross-sectional view illustrating another embodiment of FIG. 4.

FIGS. 4 and 5 are schematic cross-sectional views illustrating semiconductor packages 4, 5 according to other embodiments of the present invention. Referring to FIG. 4, a semiconductor chip 37' is electrically connected to bonding pads 341' through a plurality of conductive bumps 370'. That is, the die attach pad of FIG. 3A is omitted. Then, an underfill 38' is formed between the semiconductor chip 37' and the first surface 31a of the dielectric layer 31 to encapsulate the conductive bumps 370'. In another embodiment, the underfill 38' can be omitted and the conductive bumps 370' can be encapsulated by the encapuslant 38. In another embodiment, referring to FIG. 5, only the underfill 38' is formed between the semiconductor chip 37' and the first surface 31a of the dielectric layer 31 and the encapsulant 38 is omitted.

In the present embodiment, the bonding pads 341' can be selectively connected to the connection pads 342 or 342' through the traces 340.

An UBM (Under Bump Metallurgy) (not shown) is formed on the electrode pads of the semiconductor chip 37' (not shown) for being bonded with the conductive bumps 370'. The electrode pads of the flip-chipped semiconductor chip can have any layout on demands, without specific limits. The UBM also has a variety of structures, without specific limits.

The present invention further provides a semiconductor package 3, 3', 4, 5, which has: a dielectric layer 31 made of a material used for fabricating built-up layer structures, a conductive trace layer 34 and at least a semiconductor chip 37, 37'.

The dielectric layer 31 has a first surface 31a and a second surface 31b that is opposite the first surface 31a, and a plurality of openings 310 penetrating the first and second surfaces 31a, 31b. The dielectric layer 31 can be made of one of the materials selected from polyimide, ABF, a glass epoxy composite material, a fiber reinforced glass composite material, or a glass ceramic and epoxy composite material.

The conductive trace layer 34 is formed on the first surface 31a of the dielectric layer 31 and has a plurality of traces 340 which connect a plurality of bonding pads 341, 341' to a plurality of connection pads 342, 342'. The connection pads 342, 342' are exposed from the openings 310 of the dielectric layer 31. The conductive trace layer 34 is made of copper or aluminum.

The semiconductor chip 37, 37' is disposed on the first surface 31a of the dielectric layer 31 or the bonding pads 341'. The semiconductor chip 37, 37' has a plurality of electrode pads 37a that are electrically connected to the bonding pads 341, 341' through a plurality of bonding wires 370 or conductive bumps 370'.

The semiconductor package 3, 3', 4 further has an encapsulant 38 formed over the first surface 31a of the dielectric layer 31 to encapsulate the semiconductor chip 37, 37' and the conductive trace layer 34.

The semiconductor package 3, 3', 4, 5 further has a surface treated layer 35 formed on the bonding pads 341.

The semiconductor package 3, 3', 4, 5 further has a plurality of solder balls 39 formed on the connection pads 342, 342' at the openings 310.

The semiconductor package 3, 3', 4, 5 further has an adhesive 371, 38' formed between the dielectric layer 31 and the semiconductor chip 37, 37'.

In an embodiment, the conductive trace layer 34 further has a die attach pad 343 on which the semiconductor chip 37 is mounted. The die attach pad 343 can serve as an electrical connection pad.

In an embodiment, the bonding pads 341 are formed outside around the periphery of the semiconductor chip 37. In an embodiment, the bonding pads 341 are formed between the connection pads 342, 342' and the semiconductor chip 37.

According to the present invention, a dielectric layer made of a material used for fabricating built-up layer structures is formed to serve as an etching stop layer and a solder mask layer so as for a conductive trace layer made of copper or aluminum to be formed thereon. Therefore, the present invention eliminates the need of a gold material used in forming the conductive trace layer and dispenses with the conventional solder mask layer and electroless plated copper layer, thereby reducing fabrication cost.

Further, since a strong bonding is formed between the dielectric layer and copper or aluminum, the present invention prevents delamination from occurring around the peripheries of the openings of the dielectric layer, thus improving product reliability.

In addition, by replacing the conventional long bonding wires (most are gold wires) with the conductive trace layer made of copper or aluminum, the cost is reduced and the miniaturization of the semiconductor package is thus facilitated.

The above descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a semiconductor package, comprising the steps of:
providing a carrier having a dielectric layer formed on a surface thereof, wherein the dielectric layer used for fabricating built-up layer structures;
forming a conductive trace layer on the dielectric layer, wherein the conductive trace layer has a die attach pad and a plurality of traces, each of the traces electrically connects a bonding pad and a connection pad, and the bonding pads, the connection pads, and the die attach pad are at a same level of the conductive trace layer;

attaching at least a semiconductor chip to the die attach pad on the dielectric layer and electrically connecting the semiconductor chip to the bonding pads;

forming an encapsulant over the dielectric layer to encapsulate the semiconductor chip and the conductive trace layer;

removing the carrier while retaining the dielectric layer on the encapsulant; and after forming the die attach pad on the dielectric layer, forming a plurality of openings, through which the connection pads are exposed, penetrating the dielectric layer.

2. The fabrication method of claim 1, wherein the carrier is made of metal.

3. The fabrication method of claim 1, wherein the dielectric layer is made of a material selected from the group consisting of polyimide, ABF (Ajinomoto Build-up Film), a glass epoxy composite material, a fiber reinforced glass composite material, and a glass ceramic and epoxy composite material.

4. The fabrication method of claim 1, wherein the conductive trace layer is formed by electroplating.

5. The fabrication method of claim 1, wherein the semiconductor chip is electrically connected to the bonding pads through bonding wires or conductive bumps.

6. The fabrication method of claim 1, wherein the carrier is removed by etching.

7. The fabrication method of claim 1, further comprising forming a surface treated layer on the bonding pads.

8. The fabrication method of claim 1, further comprising forming a plurality of solder balls at the openings of the dielectric layer.

9. The fabrication method of claim 1, further comprising forming an adhesive between the dielectric layer and the semiconductor chip.

* * * * *